United States Patent
Aiello et al.

(10) Patent No.: US 7,679,313 B2
(45) Date of Patent: Mar. 16, 2010

(54) POWER DELIVERY SYSTEM INCLUDING INTERCHANGEABLE CELLS

(75) Inventors: Marc F. Aiello, Oakmont, PA (US); Xuan Zhang, Monroeville, PA (US)

(73) Assignee: Siemens Industry, Inc., Alpharetta, GA (US)

( * ) Notice: Subject to any disclaimer, the term of this patent is extended or adjusted under 35 U.S.C. 154(b) by 351 days.

(21) Appl. No.: 11/511,713

(22) Filed: Aug. 29, 2006

(65) Prior Publication Data

US 2007/0046252 A1 Mar. 1, 2007

Related U.S. Application Data

(60) Provisional application No. 60/713,198, filed on Aug. 31, 2005, provisional application No. 60/713,197, filed on Aug. 31, 2005.

(51) Int. Cl.
*H02J 7/00* (2006.01)
*H02M 7/00* (2006.01)
*H02J 1/12* (2006.01)

(52) U.S. Cl. ............... 320/103; 320/107; 320/130; 363/123; 363/132; 307/46; 307/64; 307/66

(58) Field of Classification Search .......... 320/103, 320/107, 130; 363/123, 132
See application file for complete search history.

(56) References Cited

U.S. PATENT DOCUMENTS

| | | | |
|---|---|---|---|
| 3,721,890 A * | 3/1973 | Ettinger et al. | 363/144 |
| 4,788,635 A | 11/1988 | Heinrich | |
| 5,625,545 A | 4/1997 | Hammond | |
| 6,301,130 B1 | 10/2001 | Aiello et al. | |
| 6,762,947 B2 | 7/2004 | Hammond | |
| 2003/0231517 A1 * | 12/2003 | Bixel | 363/71 |

FOREIGN PATENT DOCUMENTS

| | | |
|---|---|---|
| DE | 29914308 U1 | 2/2000 |
| EP | 1443634 A | 8/2004 |

OTHER PUBLICATIONS

U.S. Appl. No. 11/419,064, filed May 18, 2006, Rastogi et al.

* cited by examiner

*Primary Examiner*—Edward Tso
*Assistant Examiner*—Yalkew Fantu
(74) *Attorney, Agent, or Firm*—Michael J. Wallace (57) ABSTRACT

A power cell system includes a structure that provides multiple power cell locations. The system also includes at least one regenerative power cell, and at least one non-regenerative power cell. The cell locations and power cells are sized and positioned so that each cell location may interchangeably accept either a regenerative power cell or a non-regenerative power cell.

18 Claims, 7 Drawing Sheets

PRIOR ART

POWER DELIVERY SYSTEM INCLUDING INTERCHANGEABLE CELLS

CROSS-REFERENCE TO RELATED APPLICATIONS

This patent application claims priority to, and incorporates by reference in its entirety, the following applications: (i) U.S. Provisional Patent Application No. 60/713,198, entitled "A system and method for a configurable power infrastructure including interchangeable cells," filed Aug. 31, 2005; and (ii) U.S. Provisional Patent Application No. 60/713,197, entitled "Packaging method for modular multilevel power cells and system infrastructure," filed Aug. 31, 2005.

STATEMENT REGARDING FEDERALLY SPONSORED RESEARCH

Not applicable.

NAMES OF PARTIES TO A JOINT RESEARCH AGREEMENT

Not applicable.

INCORPORATION BY REFERENCE OF MATERIAL ON DISK

Not applicable.

BACKGROUND

Figure 1:
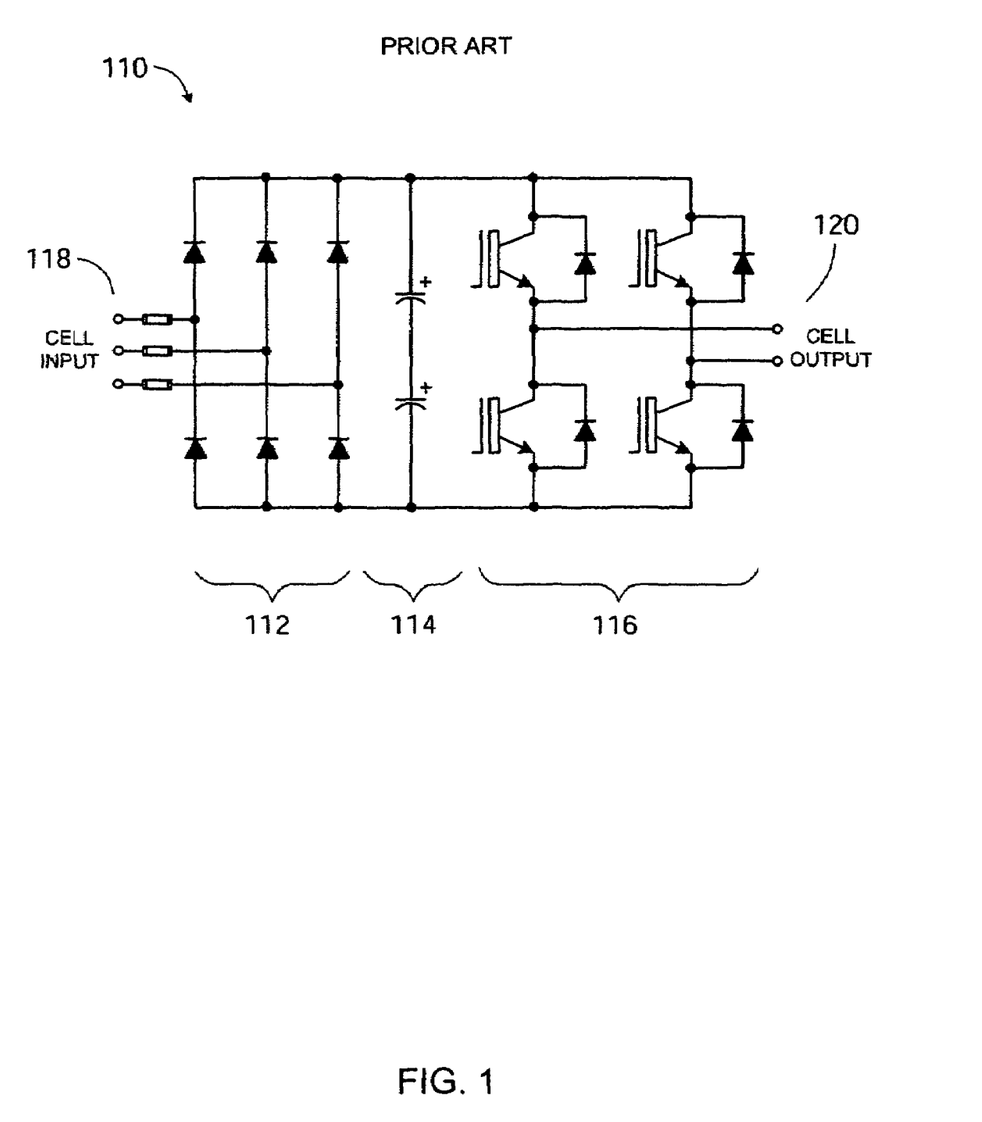
FIG. 1 is a circuit diagram showing exemplary characteristics of a prior art non-regenerative power cell.

In recent years, circuits for medium-voltage variable frequency drive (VFD) applications have received attention. Several novel methods have been introduced in the past decade. For example, in a circuit comprising series-connected inverters as described in U.S. Pat. No. 5,625,545 to Hammond, the disclosure of which is incorporated herein by reference in its entirety, an inverter or power cell 110 includes a three-phase diode-bridge rectifier 112, one or more direct current (DC) capacitors 114, and an H-bridge inverter 116. The rectifier 112 converts the input 118 alternating current (AC) voltage to a substantially constant DC voltage that is supported by the capacitors 114 that are connected across the rectifier 112 output. The output stage of the inverter 110 includes an H-bridge inverter 116 that includes two poles, a left pole and a right pole, each with two devices. The inverter 110 transforms the DC voltage across the DC capacitors 114 to an AC output 120 using pulse-width modulation (PWM) of the semiconductor devices in the H-bridge inverter 116.

A circuit including power cells such as 110 in FIG. 1, when connected to a load, such as a motor, can provide power from an input source to the motor when operating in the motoring mode. Such a power cell may sometimes be referred to as a unidirectional or two-quadrant (2Q) cell. This is because when the four quadrants of speed and torque are considered, referring to FIG. 2, the operating characteristics 210 of this cell are such that it operates in either the quadrant where both speed and torque are positive (first quadrant 201) or the quadrant where both speed and torque are negative (third quadrant 203).

Figure 2:
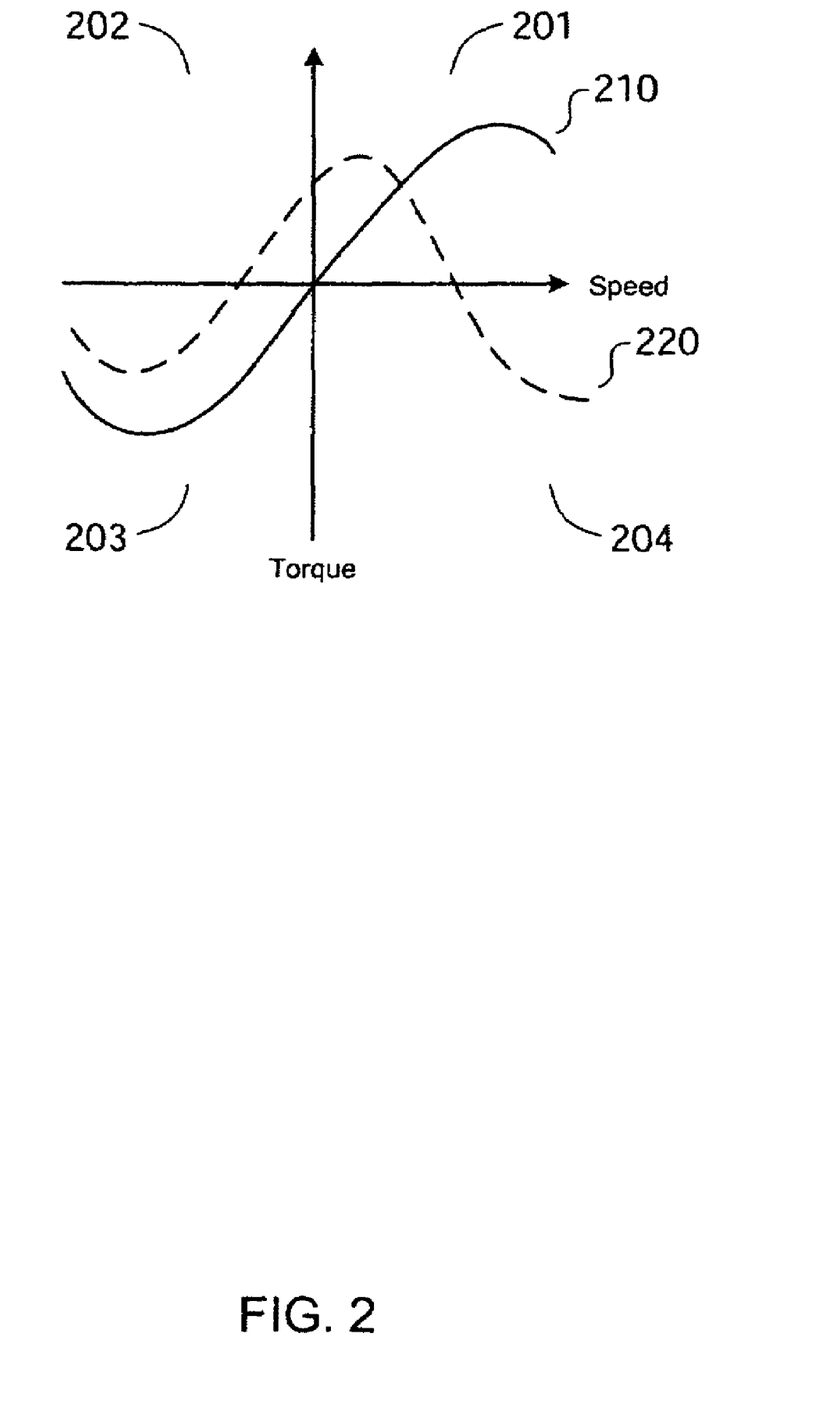
FIG. 2 depicts operating in four quadrants of speed and torque.
Figure 3:
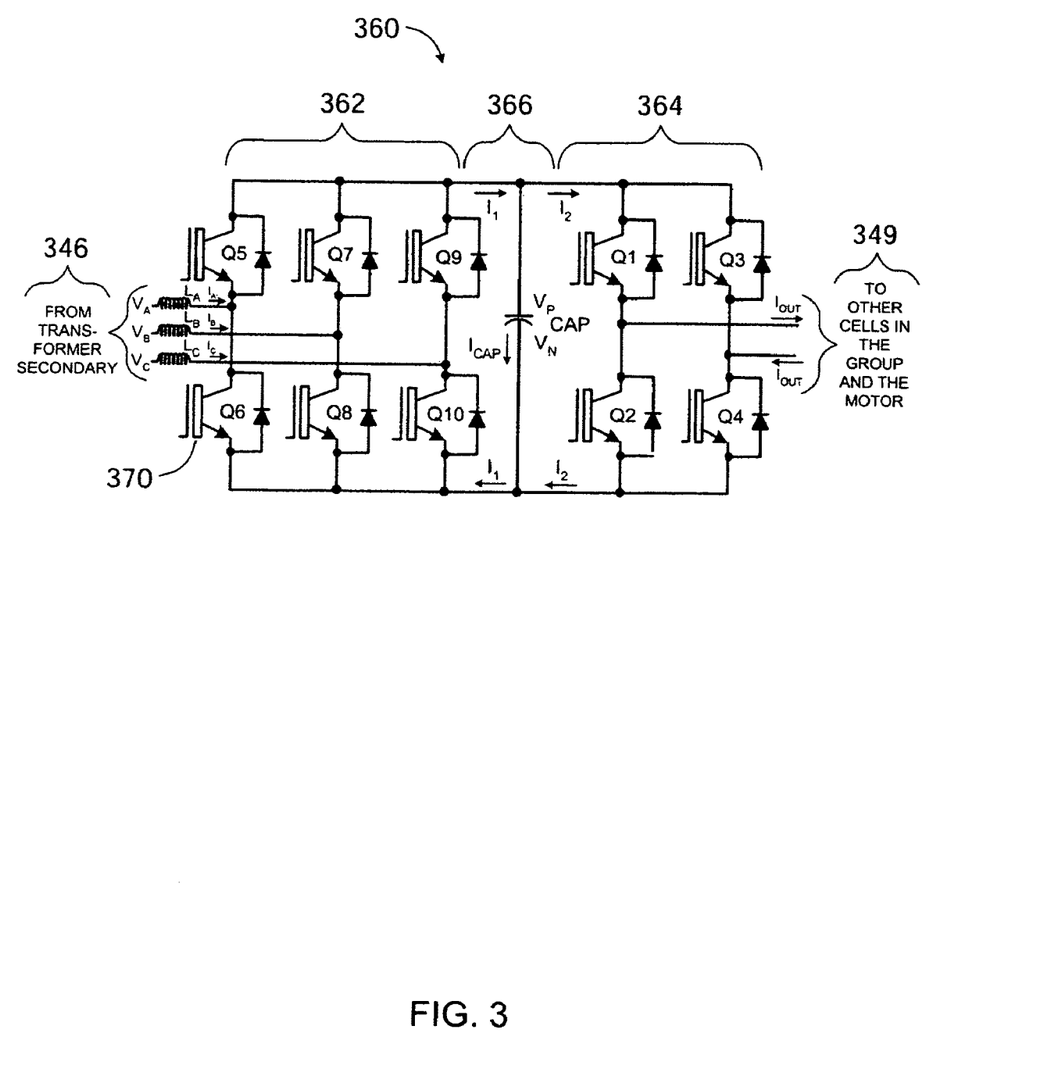
FIG. 3 is a circuit diagram showing exemplary characteristics of a prior art regenerative power cell.

However, when the motor speed needs to be reduced, power from the motor needs to be absorbed by the inverter. This mode of operation, when power must be absorbed by the inverter, is referred to as the regeneration mode. In such situations, regenerative or four-quadrant cells are required. An example of a regenerative cell is shown in U.S. Pat. No. 6,301,130 to Hammond. As shown in FIG. 3, a regenerative power cell 360 may include an active front end 362 that serves as a first converter that uses insulated gate bipolar transistors (IGBTs) Q5-Q10 or other switching devices controlled by PWM. The first converter 362 is electrically connected in parallel to a second converter 364 and to one or more DC link capacitors 366. Such a cell receives power from a transformer 346 and delivers it to other cells in the group and a load 349. Referring to FIG. 2, this cell permits operating characteristics 220 in all four quadrants 201-204, including the quadrant where both speed and torque are positive (first quadrant 201), the quadrant where torque is positive and speed is negative (second quadrant 202), the quadrant where both speed and torque are negative (third quadrant 203), and the quadrant where torque is negative and speed is positive (fourth quadrant 204).

In the prior art, motor systems included two-quadrant or four-quadrant cells. However, systems that are designed to accommodate one or the other are limited in applicability. The disclosure contained herein describes attempts to solve one or more of the problems described above.

SUMMARY

In an embodiment, a power cell system includes a support structure having a plurality of cell locations, at least one regenerative power cell, and at least one non-regenerative power cell. The cell locations and power cells are sized and positioned so that each cell location may interchangeably accept either a regenerative power cell or a non-regenerative power cell. Optionally, each cell location may include support rails, a power delivery bus positioned to electrically connect with an input bus of a power cell that is in the cell location, and a power output bus positioned to electrically connect with an input bus of the power cell that is in the cell location. In addition, each power cell may include a chassis, such that each chassis in the system has substantially the same size and shape as the other chassis in the system. The system also may include a wire tray that holds control wire for each power cell.

In an alternate embodiment, a power cell system includes a plurality of support rails and a back plane that are connected to provide a plurality of cell locations. The system also includes at least one regenerative power cell, and at least one non-regenerative power cell. The cell locations and power cells are sized and positioned so that each cell location may interchangeably accept either a regenerative power cell or a non-regenerative power cell. Each power cell includes a chassis, and each chassis in the system has substantially the same size and shape as the chassis for a at least some of the other power cells in the system. Optionally, each cell location may include a plurality of support rails, a power delivery bus positioned to electrically connect with an input bus of a power cell that is in the cell location, and a power output bus positioned to electrically connect with an input bus of the power cell that is in the cell location. The system also may include a wire tray that holds control wire for each power cell.

In an alternate embodiment, a power delivery system includes a support structure comprising a plurality of cell locations, at least one regenerative power cell, and at least one non-regenerative power cell. The cell locations and power cells may be sized and positioned so that each cell location may interchangeably accept either a regenerative power cell or a non-regenerative power cell. Each power cell may include a chassis, and each chassis in the system may have substantially the same size and shape as the chassis for a at least some of the other power cells in the system. Each cell location may include a plurality of support rails, a power delivery bus positioned to electrically connect with an input bus of a power cell that is in the cell location, and a power output bus positioned to electrically connect with an input bus of the power cell that is in the cell location.

In each of the embodiments described above, each regenerative power cell may optionally include an inverter bridge, a capacitor set electrically connected across terminals of the inverter bridge, and an active front end that includes a plurality of transistors electrically connected as a three-phase bridge. Alternatively, each regenerative power cell may include an inverter bridge, a capacitor set electrically connected across terminals of the inverter bridge, a three-phase diode bridge rectifier electrically connected across the terminals, and a series-connected transistor and resistor combination that is electrically connected across the terminals. Also optionally, each non-regenerative power cell may include an inverter bridge, a capacitor set electrically connected across terminals of the inverter bridge, and a three-phase bridge rectifier electrically connected across the terminals. Other configurations of regenerative and non-regenerative cells are possible.

DETAILED DESCRIPTION

Before the present methods, systems and materials are described, it is to be understood that this disclosure is not limited to the particular methodologies, systems and materials described, as these may vary. It is also to be understood that the terminology used in the description is for the purpose of describing the particular versions or embodiments only, and is not intended to limit the scope. For example, as used herein and in the appended claims, the singular forms "a," "an," and "the" include plural references unless the context clearly dictates otherwise. Unless defined otherwise, all technical and scientific terms used herein have the same meanings as commonly understood by one of ordinary skill in the art. In addition, the following terms are intended to have the following definitions herein:

comprising—including but not limited to.

electrically connected or electrically coupled—connected in a manner adapted to transfer electrical energy.

H-bridge inverter—a circuit for controlled power flow between AC and DC circuits having four transistors and four diodes. Referring to FIG. 1, an H-bridge inverter 116 generally includes a first phase leg and a second phase leg electrically connected in parallel. Each leg includes two transistor/diode combinations. In each combination, the diode is electrically coupled across the base and emitter of the transistor.

inverter—a device that converts DC power to AC power or AC power to DC power.

medium voltage—a rated voltage greater than 690 volts (V) and less than 69 kilovolts (kV). In some embodiments, medium voltage may be a voltage between about 1000 V and about 69 kV.

non-regenerative power cell—a power cell that does not have the capability of absorbing regenerative power.

power cell—an electrical device that has a three-phase alternating current input and a single-phase alternating current output.

rank—an arrangement of power cells established across each phase of a three-phase power delivery system.

regenerative power cell—a power cell that has the capability of absorbing regenerative power.

substantially—to a great extent or degree.

Figure 4:
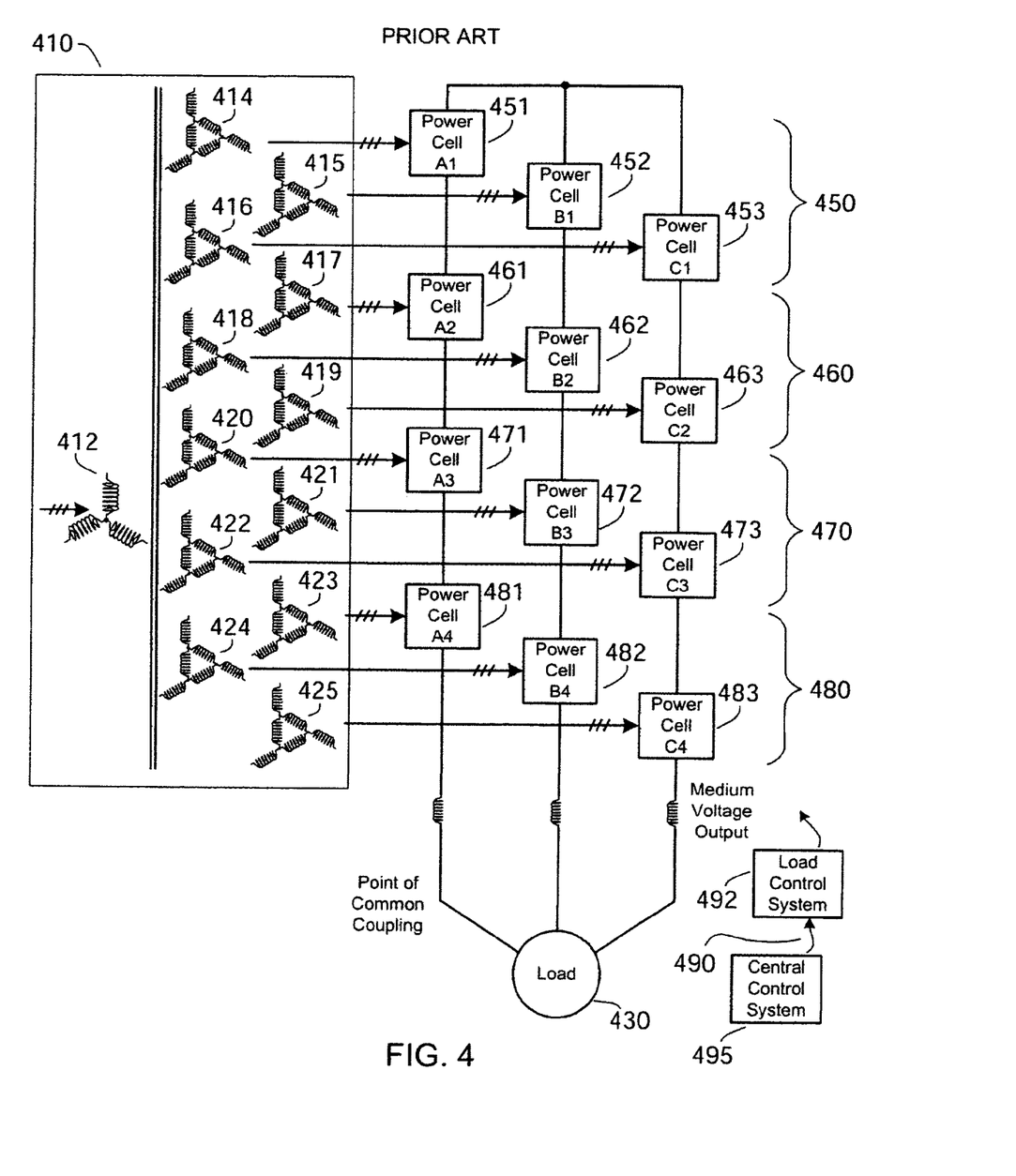
FIG. 4 depicts a circuit comprising a plurality of power cells connected to a load.

In various embodiments, a multi-level power circuit includes a plurality of power cells to drive a load. FIG. 4 illustrates an exemplary embodiment of a circuit having such power cells. In FIG. 4, a transformer 410 delivers three-phase, medium-voltage power to a load 430 such as a three-phase induction motor via an array of single-phase inverters (also referred to as power cells). The transformer 410 includes primary windings 412 that excite a number of secondary windings 414-425. Although primary winding 412 is illustrated as having a star configuration, a mesh configuration is also possible. Further, although secondary windings 414-425 are illustrated as having a mesh configuration, star-configured secondary windings are possible, or a combination of star and mesh windings may be used. Further, the number of secondary windings illustrated in FIG. 4 is merely exemplary, and other numbers of secondary windings are possible. The circuit may be used for medium voltage applications or, in some embodiments, other applications.

Any number of ranks of power cells are connected between the transformer 410 and the load 430. A "rank" is considered to be a three-phase set, or a group of power cells established across each of the three phases of the power delivery system. Referring to FIG. 4, rank 450 includes power cells 451-453, rank 460 includes power cells 461-463, rank 470 includes power cells 471-273, and rank 480 includes power cells 481-483. Fewer than four ranks, or more than four ranks, are possible. A central control system 495 sends command signals to local controls in each cell over fiber optics or another wired or wireless communications medium 490.

Figure 5:
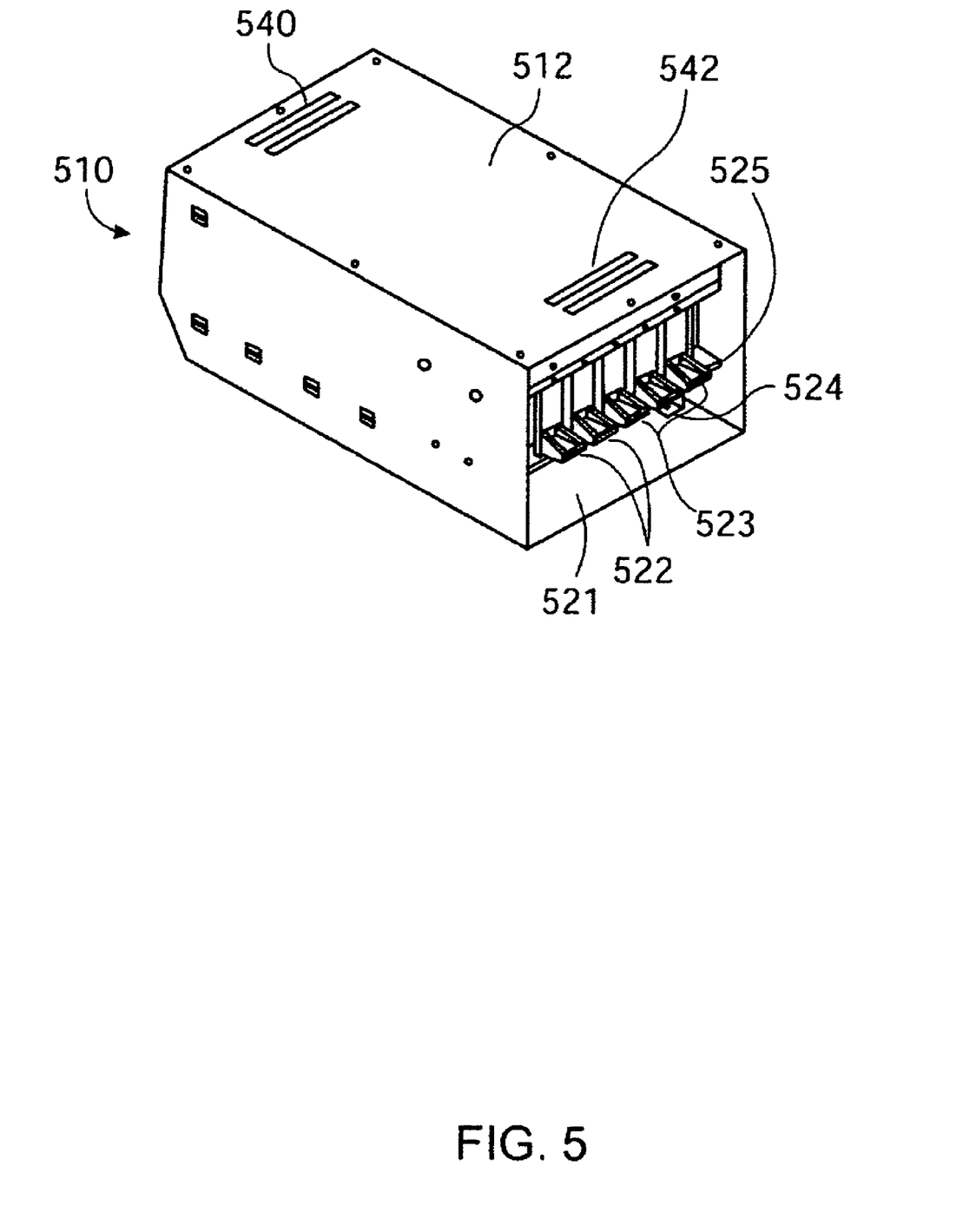
FIG. 5 illustrates an exemplary power cell housing structure.

FIG. 5 illustrates an exemplary power cell structure 510. The power cell 510 includes a chassis 512 and a set of power input/output connectors 521-525. Exemplary internal components of the cell may include any number of capacitors, a heat sink, and an electronics assembly that may include items such as insulated gate bipolar transistor (IGBT) modules and one or more rectifier modules. The IGBTs may be separated for I/O bus locations and to increase thermal performance.

The chassis 512 encloses various components of the power cell 510, such as one or more capacitors, printed circuit boards, heat sinks, etc. The chassis 512 may be fabricated from any suitable material, such as galvanized steel or another metal, that both mechanically and electromagnetically isolates the power cell from other power cells in the system during both normal operation and many abnormal operating conditions. The chassis 512 may serve to protect internal components of the power cell 510 from damage during shipping and handling, and it may be configured in a manner such that the electronic module 510 can be placed on any of its sides without causing any damage to the components of the electronic module 510. According to various embodiments, the chassis 512 may be comprised of several portions connected together, and one or more portions of the chassis 512 may be removable. In addition, the chassis 512 may be of a thickness sufficient to prevent any debris resulting from a failure of the internal components of the electronic module 510 from exiting the space enclosed by the chassis 512, thereby preventing any collateral damage to other components in the vicinity of the electronic module 510.

As shown in FIG. 5, the power cell 510 may further comprise a plurality of power plug connectors 521-525 coupled to an internal input or output power bus that is configured to route power to and from the electronic module 510. For example, three of the power plug connectors 522-524 may be configured to receive three-phase power from a source, while two of the power plug connectors 521 and 525 may be configured to deliver single-phase power to a load. The power plug connectors permit the cells to be plugged into a master power plane.

The power cell arrangement described in FIGS. 4 and 5 provides a modular, multilevel system that allows cells to be replaced as needed to accommodate different design requirements, or to replace a failed cell. In addition, the cells 510 shown in FIG. 5 are physically interchangeable so that they may contain either the elements of a two-quadrant cell, such as the elements shown in FIG. 1, or the elements of a regenerative (four-quadrant) cell, such as the elements shown in FIG. 3. In this manner, individual cell locations can be populated replaced as with regenerative or non-regenerative cell as necessary to provide for a desired degree of braking. The chassis 512 of each cell 510 will thus have substantially the same size and shape, regardless or whether it is a regenerative cell or non-regenerative cell.

Figure 6:
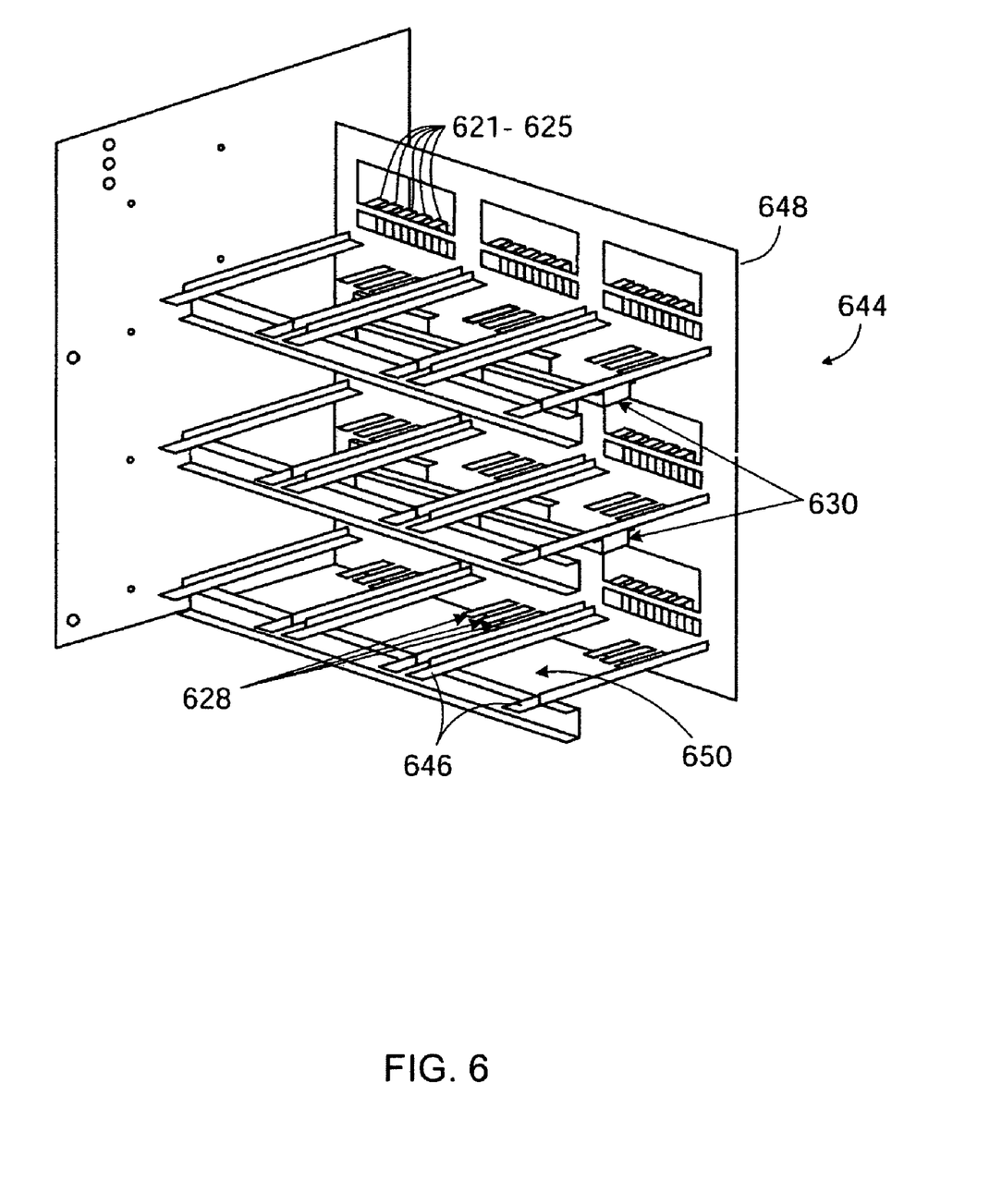
FIG. 6 illustrates an exemplary support structure for multiple power cells.

FIG. 6 illustrates an exemplary support structure 644 for multiple power cells, such as nine cells, within a housing wherein each power cell or other electronic module is positioned on one or more mounting rails 646 so that the rear of each cell faces a backplane 648 and the cell's power plugs contact the cell power connections 621-625 through the backplane 648. The backplane 648 may be fabricated from any suitable non-conductive material, such as a high-strength non-conductive laminate material, and it provides a barrier between individual cells and other aspects of the system.

Figure 7:
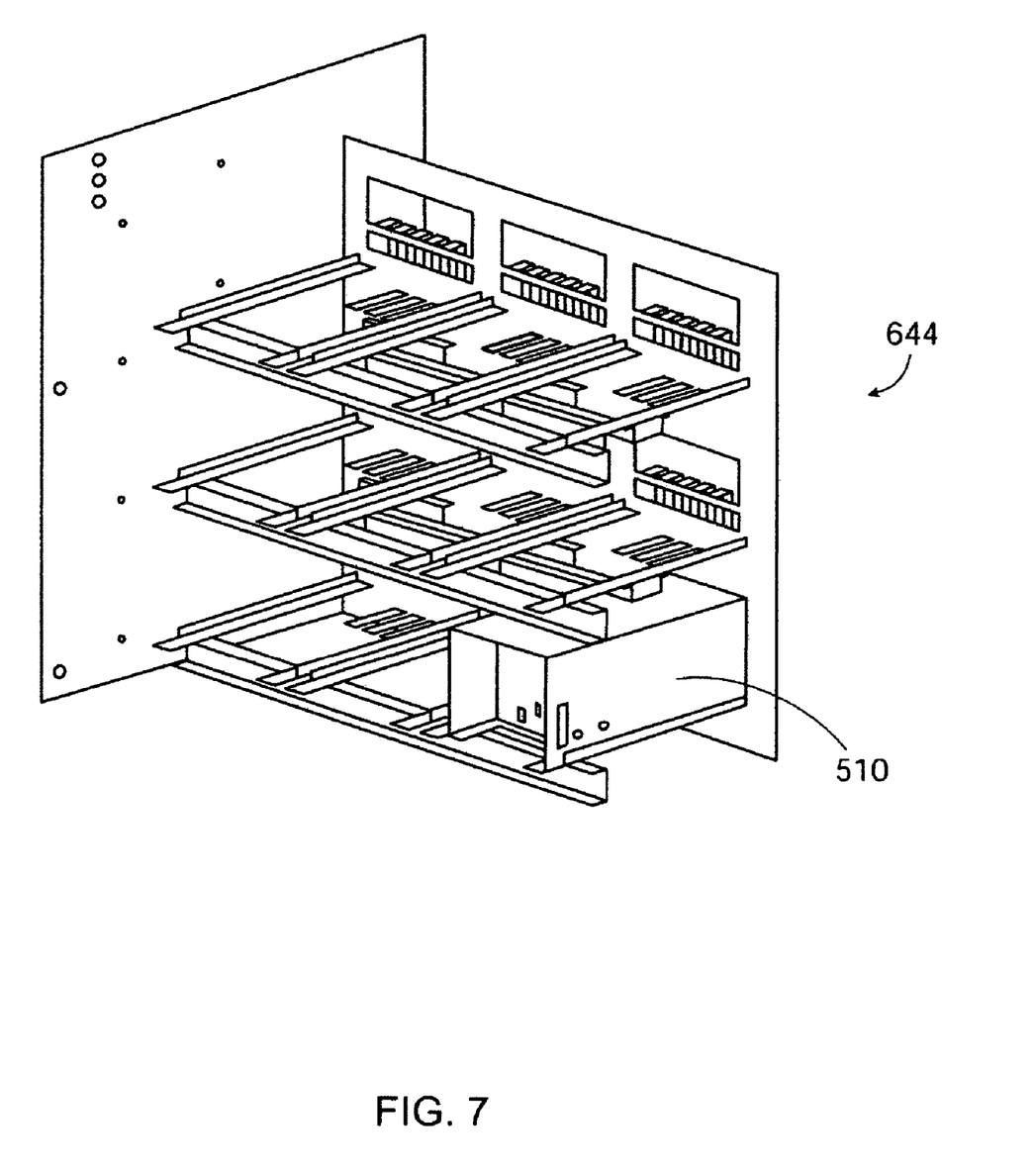
FIG. 7 illustrates the support structure of FIG. 6 with a cell positioned in a cell location.

The support structure is designed to provide a plurality of cell locations 650, each of which may receive an interchangeable cell (such as 510 in FIG. 5) that is either a regenerative cell or a non-regenerative cell. In this manner, a single power cell system may include all regenerative cells, all non-regenerative cells, or some mixture of regenerative and non-regenerative cells depending on the desired degree of braking. A cell 510 may be sized to slide into a cell location 650 along the support rails 646, and the cell's power plugs will then engage the cell power connections 621-625. Optionally, additional connections such as wire trays 630 may be provided to accommodate control wires that are routed to and from the cells. Also optionally, one or more secondary power busses 628 may be provided for the direction of current to or from each cell. FIG. 7 illustrates the exemplary support structure 644 with a power cell 510 positioned in one of the cell locations.

Still other embodiments will become readily apparent to those skilled in this art from reading the above-recited detailed description and drawings of certain exemplary embodiments. It should be understood that numerous variations, modifications, and additional embodiments are possible, and accordingly, all such variations, modifications, and embodiments are to be regarded as being within the spirit and scope of this application

What is claimed is:

1. A power cell system, comprising:
   a support structure comprising a plurality of cell locations;
   at least one regenerative power cell configured to function as a regenerative power cell; and
   at least one non-regenerative power cell configured to function as a non-regenerative power cell;
   wherein the cell locations and power cells are sized and positioned so that each cell location may interchangeably accept either a regenerative power cell or a non-regenerative power cell; and
   wherein positioning of the power cells is configured such that both the at least one regenerative power cell and the at least one non-regenerative power cell are concurrently functioning to either provide power to or absorb power from a load.

2. The system of claim 1, wherein each cell location comprises:
   a plurality of support rails;
   a power delivery bus positioned to electrically connect with an input bus of a power cell that is in the cell location; and
   a power output bus positioned to electrically connect with an input bus of the power cell that is in the cell location.

3. The system of claim 1, each regenerative power cell comprises:
   an inverter bridge;
   a capacitor set electrically connected across terminals of the inverter bridge; and
   an active front end comprising a plurality of transistors electrically connected as a three-phase bridge.

4. The circuit of claim 1, wherein each regenerative power cell comprises:
   an inverter bridge;
   a capacitor set electrically connected across terminals of the inverter bridge;
   a three-phase diode bridge rectifier electrically connected across the terminals; and
   a series-connected transistor and resistor combination that is electrically connected across the terminals.

5. The system of claim 1, wherein each non-regenerative power cell comprises:
   an inverter bridge;
   a capacitor set electrically connected across terminals of the inverter bridge; and
   a three-phase bridge rectifier electrically connected across the terminals.

6. The system of claim 1, wherein each power cell comprises a chassis, and each chassis in the system has substantially the same size and shape as the other chassis in the system.

7. The system of claim 1, further comprising a wire tray that holds control wire for each power cell.

8. A power cell system, comprising:
   a plurality of support rails and a back plane that are connected to provide a plurality of cell locations;
   at least one regenerative power cell configured to function as a regenerative power cell; and
   at least one non-regenerative power cell configured to function as a non-regenerative power cell;
   wherein the cell locations and power cells are sized and positioned so that each cell location may interchangeably accept either a regenerative power cell or a non-regenerative power cell;
   wherein positioning of the power cells is configured such that both the at least one regenerative power cell and the at least one non-regenerative power cell are concurrently functioning to either provide power to or absorb power from a load; and wherein each power cell comprises a chassis, and each chassis in the system has substantially the same size and shape as the chassis for a plurality of other power cells in the system.

9. The system of claim 8, wherein each cell location comprises:
a plurality of support rails;
a power delivery bus positioned to electrically connect with an input bus of a power cell that is in the cell location; and
a power output bus positioned to electrically connect with an input bus of the power cell that is in the cell location.

10. The system of claim 8, each regenerative power cell comprises:
an inverter bridge;
a capacitor set electrically connected across terminals of the inverter bridge; and
an active front end comprising a plurality of transistors electrically connected as a three-phase bridge.

11. The circuit of claim 8, wherein each regenerative power cell comprises:
an inverter bridge;
a capacitor set electrically connected across terminals of the inverter bridge;
a three-phase diode bridge rectifier electrically connected across the terminals; and
a series-connected transistor and resistor combination that is electrically connected across the terminals.

12. The system of claim 8, wherein each non-regenerative power cell comprises:
an inverter bridge;
a capacitor set electrically connected across terminals of the inverter bridge; and
a three-phase bridge rectifier electrically connected across the terminals.

13. The system of claim 8, further comprising a wire tray that holds control wire for each power cell.

14. A power delivery system, comprising:
a support structure comprising a plurality of cell locations;
at least one regenerative power cell configured to function as a regenerative power cell; and
at least one non-regenerative power cell configured to function as a non-regenerative power cell;

wherein the cell locations and power cells are sized and positioned so that each cell location may interchangeably accept either a regenerative power cell or a non-regenerative power cell;

wherein positioning of the power cells is configured such that both the at least one regenerative power cell and the at least one non-regenerative power cell are concurrently functioning to either provide power to or absorb power from a load;

wherein each power cell comprises a chassis, and each chassis in the system has substantially the same size and shape as the chassis for a plurality of other power cells in the system; and wherein each cell location comprises a plurality of support rails, a power delivery bus positioned to electrically connect with an input bus of a power cell that is in the cell location, and a power output bus positioned to electrically connect with an input bus of the power cell that is in the cell location.

15. The system of claim 14, each regenerative power cell comprises:
an inverter bridge;
a capacitor set electrically connected across terminals of the inverter bridge; and
an active front end comprising a plurality of transistors electrically connected as a three-phase bridge.

16. The circuit of claim 14, wherein each regenerative power cell comprises:
an inverter bridge;
a capacitor set electrically connected across terminals of the inverter bridge;
a three-phase diode bridge rectifier electrically connected across the terminals; and
a series-connected transistor and resistor combination that is electrically connected across the terminals.

17. The system of claim 14, wherein each non-regenerative power cell comprises:
an inverter bridge;
a capacitor set electrically connected across terminals of the inverter bridge; and
a three-phase bridge rectifier electrically connected across the terminals.

18. The system of claim 14, further comprising a wire tray that holds control wire for each power cell.

* * * * *